(12) United States Patent
Tsai et al.

(10) Patent No.: US 11,257,711 B1
(45) Date of Patent: Feb. 22, 2022

(54) FABRICATING METHOD OF TRANSISTORS WITHOUT DISHING OCCURRED DURING CMP PROCESS

(71) Applicant: UNITED MICROELECTRONICS CORP., Hsin-Chu (TW)

(72) Inventors: Fu-Shou Tsai, Keelung (TW); Yang-Ju Lu, Changhua County (TW); Yong-Yi Lin, Miaoli County (TW); Yu-Lung Shih, Tainan (TW); Ching-Yang Chuang, Pingtung County (TW); Ji-Min Lin, Taichung (TW); Kun-Ju Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 47 days.

(21) Appl. No.: 17/023,391

(22) Filed: Sep. 17, 2020

(51) Int. Cl.
| | |
|---|---|
| *H01L 21/768* | (2006.01) |
| *H01L 21/8234* | (2006.01) |
| *H01L 21/3105* | (2006.01) |
| *H01L 21/311* | (2006.01) |
| *H01L 21/02* | (2006.01) |

(52) U.S. Cl.
CPC .. *H01L 21/76819* (2013.01); *H01L 21/31053* (2013.01); *H01L 21/823456* (2013.01); *H01L 21/0262* (2013.01); *H01L 21/02532* (2013.01); *H01L 21/02592* (2013.01); *H01L 21/31111* (2013.01); *H01L 21/31116* (2013.01); *H01L 21/823481* (2013.01)

(58) Field of Classification Search
CPC ......... H01L 21/76819; H01L 21/31053; H01L 21/823456; H01L 21/02532; H01L 21/02592; H01L 21/0262; H01L 21/31111; H01L 21/31116; H01L 21/823481
See application file for complete search history.

(56) References Cited

U.S. PATENT DOCUMENTS

| | | | |
|---|---|---|---|
| 9,190,481 B2 | 11/2015 | Zhao | |
| 2016/0104788 A1 | 4/2016 | Ryu | |
| 2020/0168507 A1* | 5/2020 | Chang | ............... H01L 29/66795 |
| 2021/0118050 A1* | 4/2021 | Quillian | ............... G06Q 40/025 |

* cited by examiner

*Primary Examiner* — Telly D Green
*Assistant Examiner* — Andre C Stevenson
(74) *Attorney, Agent, or Firm* — Winston Hsu

(57) ABSTRACT

A fabricating method of transistors includes providing a substrate with numerous transistors thereon. Each of the transistors includes a gate structure. A gap is disposed between gate structures adjacent to each other. Later, a protective layer and a first dielectric layer are formed in sequence to cover the substrate and the transistors and to fill in the gap. Next, numerous buffering particles are formed to contact the first dielectric layer. The buffering particles do not contact each other. Subsequently, a second dielectric layer is formed to cover the buffering particles. After that, a first planarization process is performed to remove part of the first dielectric layer, part of the second dielectric layer and buffering particles by taking the protective layer as a stop layer, wherein a removing rate of the second dielectric layer is greater than a removing rate of the buffering particles during the first planarization process.

15 Claims, 5 Drawing Sheets

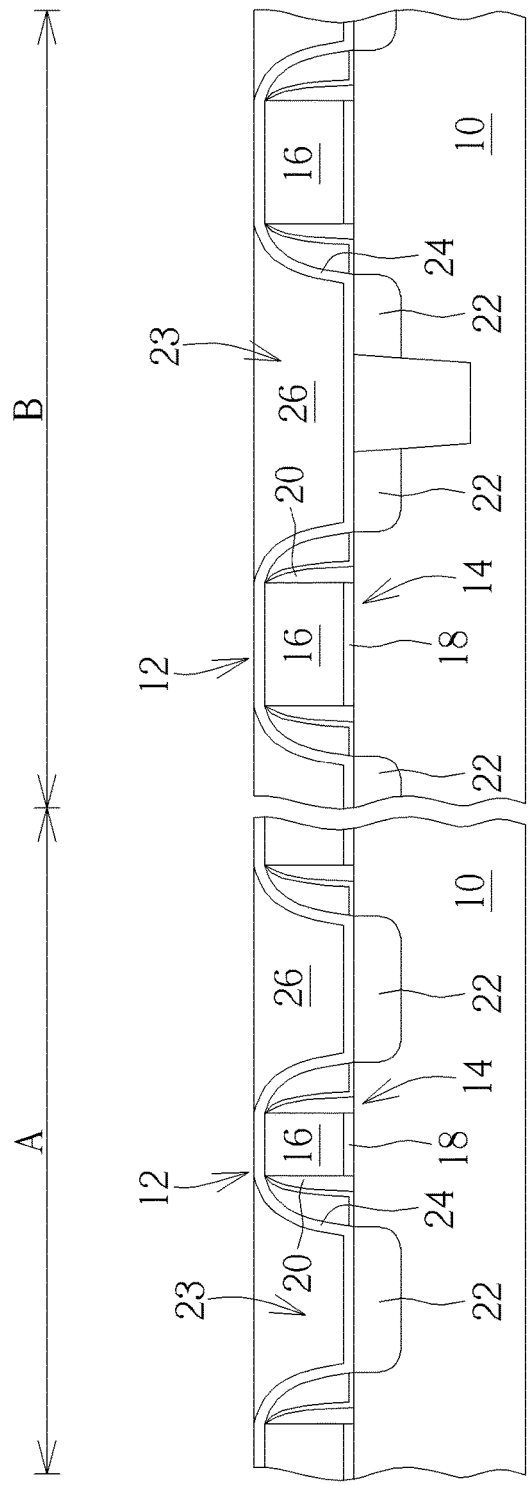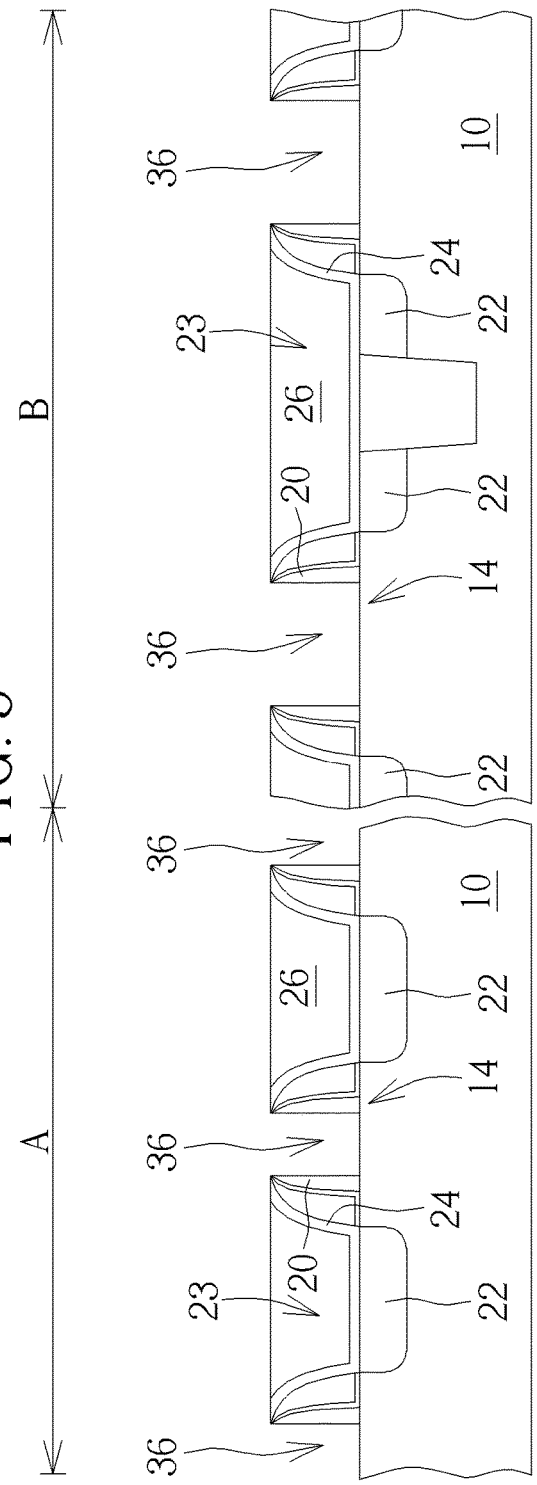

FABRICATING METHOD OF TRANSISTORS WITHOUT DISHING OCCURRED DURING CMP PROCESS

BACKGROUND OF THE INVENTION

1. Field of the Invention

The present invention relates to a method of prevention dishing in an isolation region during a chemical mechanical polishing process.

2. Description of the Prior Art

The semiconductor integrated circuit (IC) industry has experienced exponential growth. Technological advances in IC materials and design have produced generations of ICs where each generation has smaller and more complex circuits than the previous generation.

One application as technology nodes shrink, in some IC designs, has been the replacement of a polysilicon gate electrode with a metal gate electrode to improve device performance with the decreased device sizes. During replacement of the polysilicon gate electrode, a chemical mechanical polishing (CMP) process is used to expose the polysilicon gate electrode. However, as density of the polysilicon gate electrode is different in different wafer regions, a dishing may happened in a region where the polysilicon gate electrode has a lower density. Therefore, a new method is needed to prevent dishing.

SUMMARY OF THE INVENTION

According to a preferred embodiment of the present invention, a fabricating method of transistors includes providing a substrate with numerous transistors thereon. Each of the transistors includes a gate structure. A gap is disposed between gate structures which are adjacent to each other. Later, a protective layer and a first dielectric layer are formed in sequence to cover the substrate and the transistors and to fill in the gap. Next, numerous buffering particles are formed to contact the first dielectric layer. It is noteworthy that the buffering particles do not contact each other. Subsequently, a second dielectric layer is formed to cover the buffering particles. After that, a first planarization process is performed to remove part of the first dielectric layer, part of the second dielectric layer and buffering particles by taking the protective layer as a stop layer, wherein a removing rate of the second dielectric layer is greater than a removing rate of the buffering particles during the first planarization process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of transistors without dishing occurring during a CMP process, wherein:
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5; and
FIG. 7 is a fabricating stage following FIG. 6.

FIG. 8 to FIG. 9 depict another preferred embodiment which shows the buffering particles only formed within an isolation region, wherein:
FIG. 9 is a fabricating stage following FIG. 8.

DETAILED DESCRIPTION

FIG. 1 to FIG. 7 depict a fabricating method of transistors without dishing occurring during a CMP process.

Figure 1:
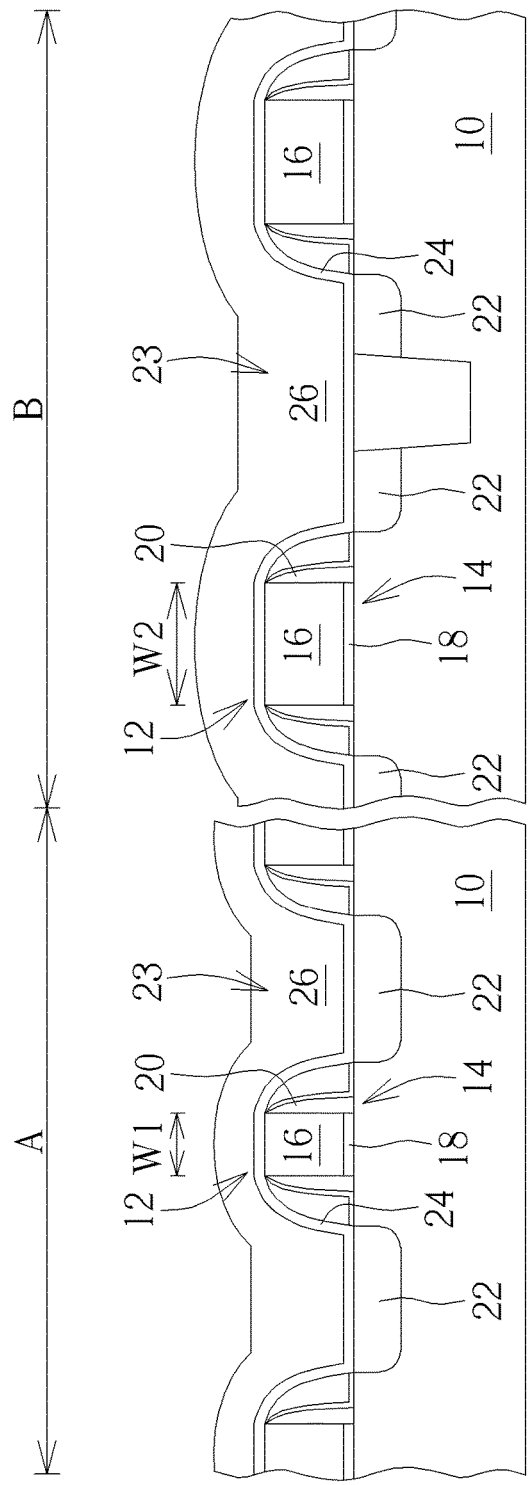

As shown in FIG. 1, a substrate 10 is provided. Numerous transistors 12 are disposed on the substrate 10. Each of the transistors 12 includes a gate structure 14 on the substrate 10. The gate structure 14 includes a dummy gate 16, a gate dielectric layer 18 and a spacer 20. The spacer 20 surrounds the dummy gate 16. Two source/drain doping regions 22 are embedded in the substrate 10 at two side of the gate structure 14. A gate dielectric layer 18 is disposed between the dummy gate 16 and the substrate 10. The substrate 10 is divided into a dense region A and an isolation region B. A gap 23 is disposed between the gate structures 14 which are adjacent to each other. The gap 23 within the dense region A is smaller than the gap 23 within the isolation region B. That is, the transistors 12 in the dense region A are closer to each other than the transistors 12 in the isolation region B. The width W1 of the dummy gate 16 within the dense region A is preferably smaller than the width W2 of the dummy gate 16 within the isolation region B. The dummy gate 16 may be formed by polysilicon.

Later, a protective layer 24 is formed to conformally cover the substrate 10 and the transistors 12 in the dense region A and the isolation region B, and fill in the gap 23. The protective layer 24 is preferably silicon nitride, silicon oxynitride, silicon carbide nitride or silicon carboxynitride. Next, a first dielectric layer 26 is formed to cover the protective layer 24.

Figure 2:
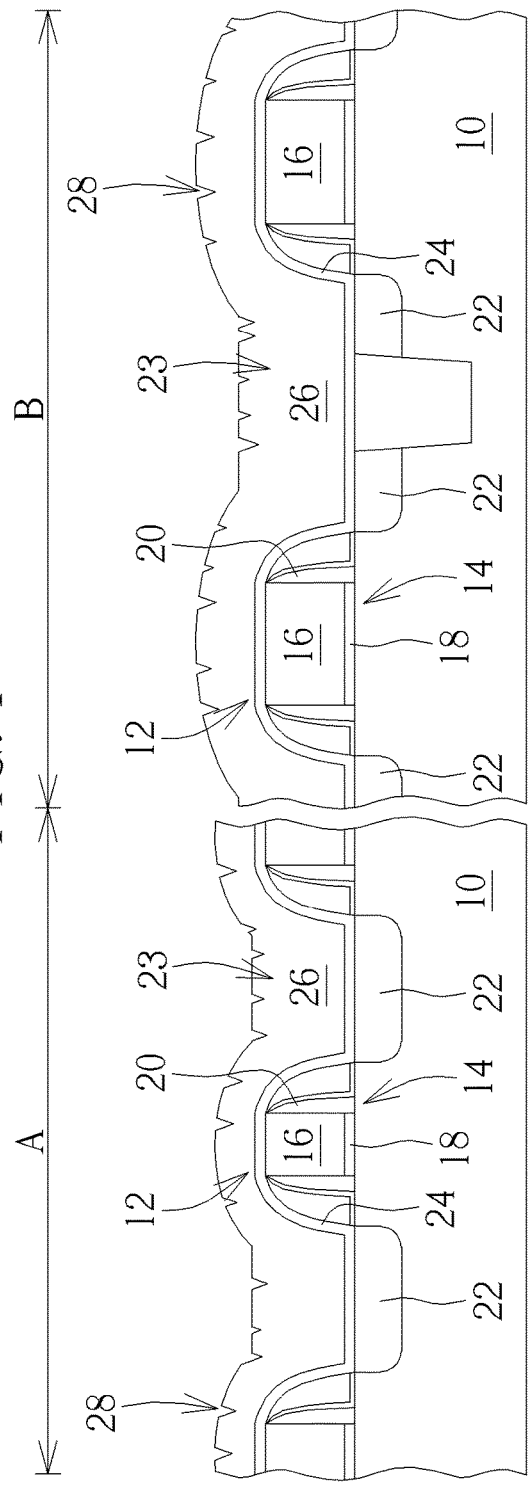

As shown in FIG. 2, a roughening process is optionally performed to roughen the surface of the first dielectric layer 26. The roughening process may be a dry etch or a wet etch process. For example, the dry etch can be performed by using $CF_4$ as an etchant. The wet etch can be performed by using dilute hydrofluoric acid solution as an etchant. After the roughening process, the top surface of the first dielectric layer 26 becomes uneven. That is, there are numerous recesses 28 formed on the top surface of the first dielectric layer 26.

Figure 3:
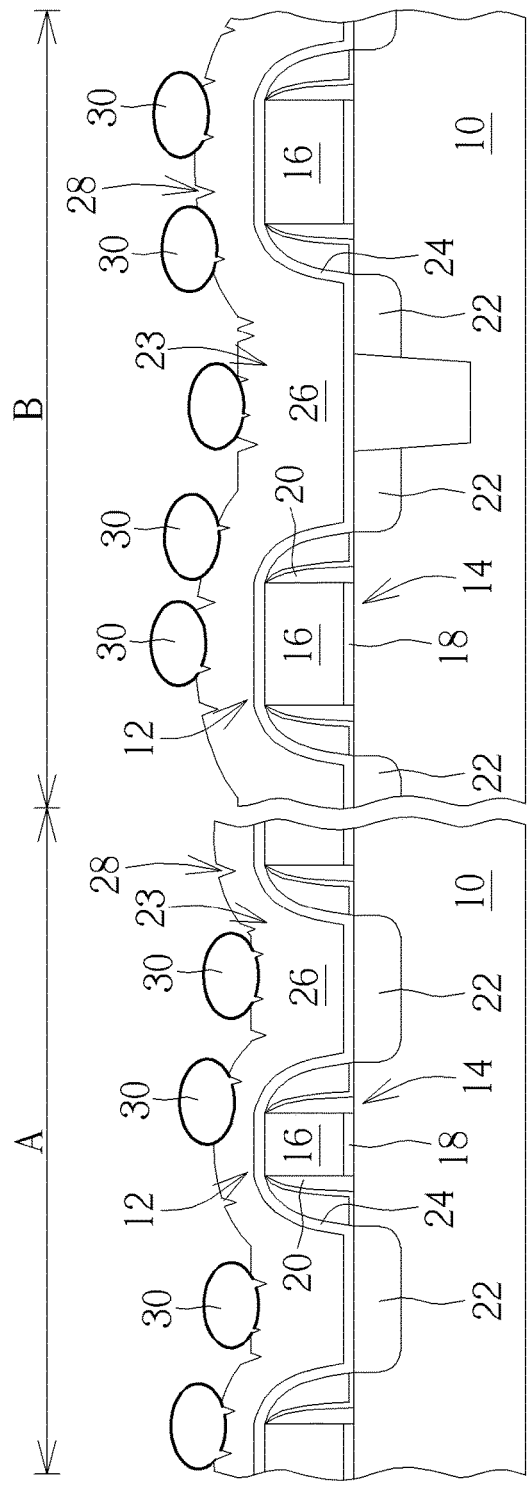

As shown in FIG. 3, numerous buffering particles 30 are formed to contact the first dielectric layer 26. The positions of the buffering particles 30 may preferably be higher than the top surface of the dummy gate 16. If the roughening process is performed, and the top surface of the first dielectric layer 26 is roughened, buffering particles 30 can be engaged into the recesses 28 on the first dielectric layer 26 to increase the adhesion ability of the buffering particles 30 to the first dielectric layer 26. According to a preferred embodiment of the present invention, the buffering particles 30 include amorphous silicon particles, polysilicon particles, silicon germanium particle or germanium particles, and the first dielectric layer 26 includes silicon oxide. Generally, the silicon-containing materials or the germanium-containing materials have good adhesion ability to the silicon oxide. Therefore, the roughening process can be omitted.

In this embodiment, the buffering particles 30 are formed on the first dielectric layer 26 within the dense region A and the isolation region B. It is noteworthy that each of the buffering particles 30 does not contact each other. In other words, the first dielectric layer 26 is exposed from the space between two buffering particles 30 next to each other.

The buffering particles 30 can be formed by a furnace annealing process or an epitaxial growth process. For example, the buffering particles 30 are amorphous silicon particles and the amorphous silicon particles are formed by a furnace annealing process. The furnace annealing process can be performed at a temperature not greater than 700° C., an operation time not greater than 30 minutes with hydrogen ($H_2$), argon (Ar), helium (He) and silane ($SiH_4$) flowing into the furnace to form amorphous silicon particles. Under these conditions, each of the amorphous silicon particles has a thickness between 50 to 100 angstroms, and a diameter of each of the amorphous silicon particles is 1.5 to 3 times of the thickness.

On the other hand, the buffering particles 30 can also be formed by an epitaxial growth process. For, example, if the buffering particles 30 are silicon germanium, the buffering particles 30 can be formed by using the epitaxial growth process to form several disconnected epitaxial layers serving as the buffering particles 30.

Figure 4:
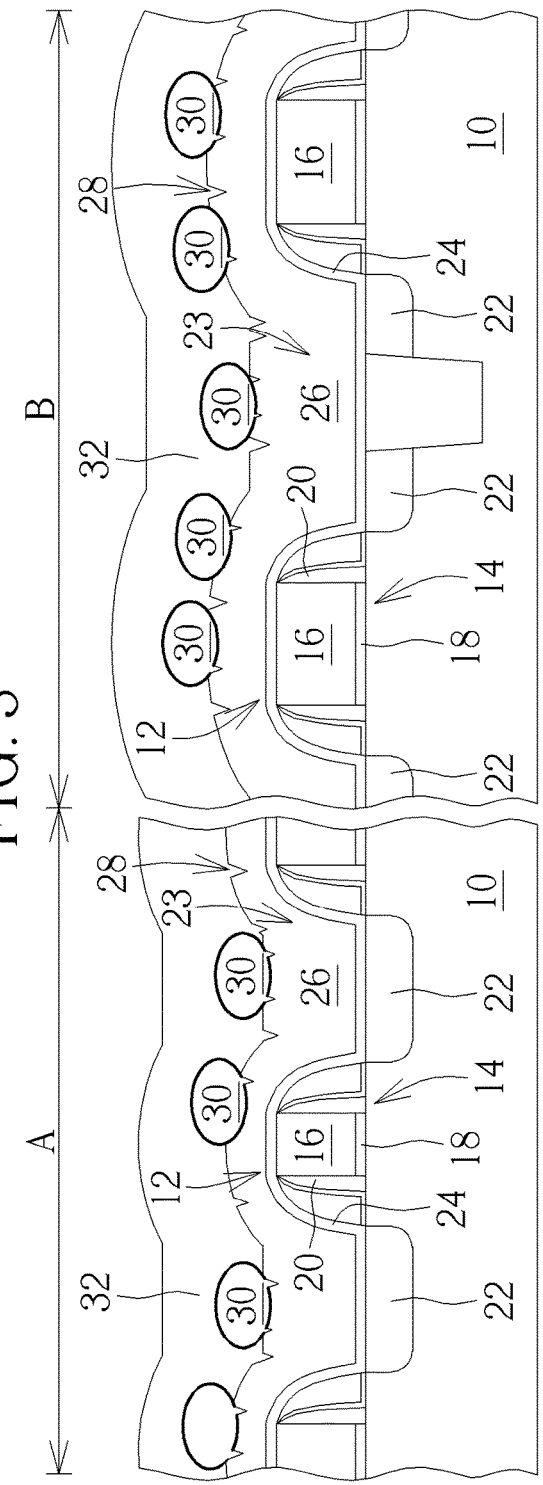
Figure 7:
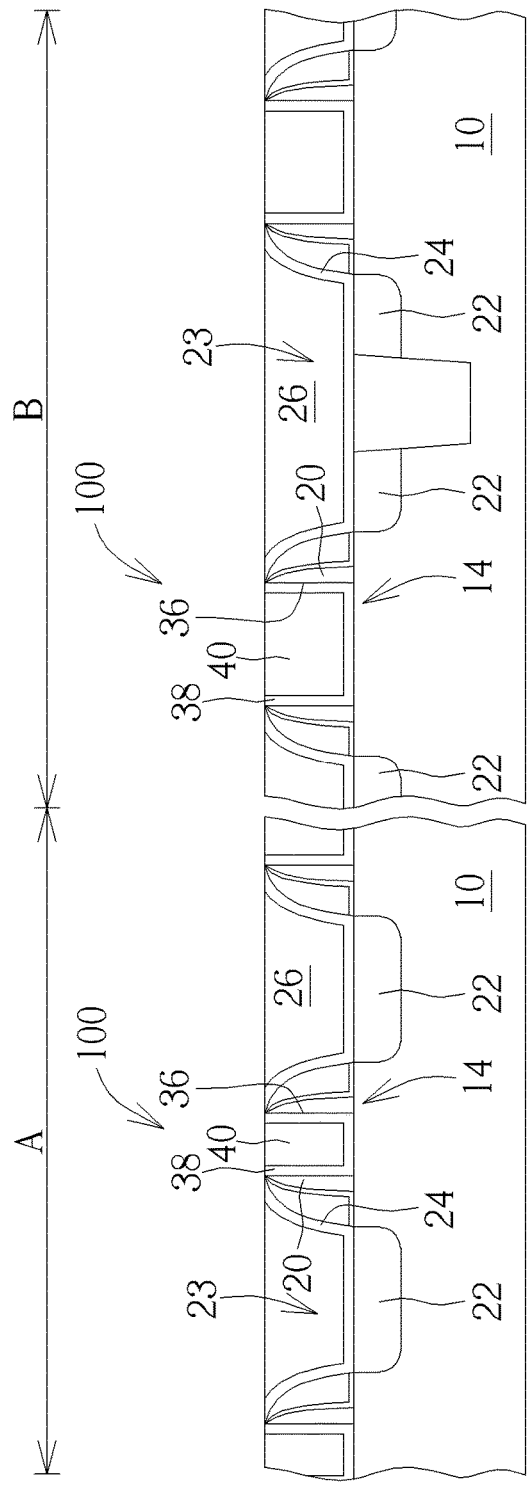

As shown in FIG. 4, a second dielectric layer 32 is formed to cover the buffering particles 30 and the first dielectric layer 26. The first dielectric layer 26 and the second dielectric layer 32 are preferably made of the same material. For example, the first dielectric layer 26 and the second dielectric layer 32 are both silicon oxide. However, based on different requirements, the first dielectric layer 26 and the second dielectric layer 32 can be made of different materials. The first dielectric layer 26 and the second dielectric layer 32 are independently including silicon oxide, silicon nitride, silicon oxynitride, silicon carbide nitride or silicon carboxynitride. It should be noted that the buffering particles 30 and the first dielectric layer 26 are made of different materials, and the buffering particles 30 and the second dielectric layer 32 are also made of different materials. For example, the first dielectric layer 26 and the second dielectric layer 32 are silicon oxide. The buffering particles 30 are amorphous silicon.

As shown in FIG. 5, a first planarization process is performed to remove part of the first dielectric layer 26, part of the second dielectric layer 32 and all of the buffering particles 30 by taking the protective layer 24 as a stop layer. The first planarization process is preferably performed by a chemical mechanical polishing (CMP) process. It is noteworthy that a removing rate of the second dielectric layer 32 is greater than a removing rate of the buffering particles 30 during the first planarization process. Furthermore, a removing rate of the first dielectric layer 26 is also greater than the removing rate of the buffering particles 30 during the first planarization process. More specifically speaking, the etching rate of the first dielectric layer 26 and the etching rate of the second dielectric layer 32 are both greater than the etching rate of the buffering particles 30 with respective to the same slurry used in the CMP process.

Figure 10:
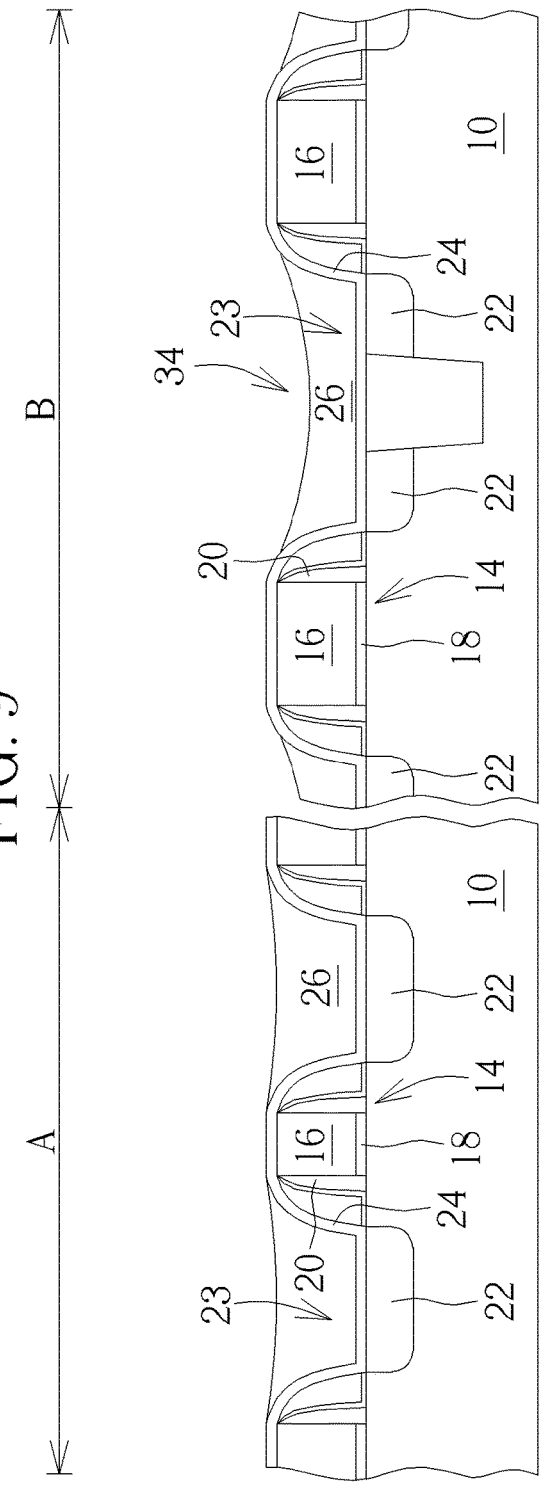
FIG. 10 depicts a fabricating method of transistors without using buffering particles during a CMP process.

Please refer to FIG. 10. Because the gap 23 between the gate structures 14 within the isolation region B is large, when the CMP process is performed without the buffering particles 30, the first dielectric layer 26 and the second dielectric layer 32 within the gap 23 or directly above the gap 23 are etched faster than the first dielectric layer 26 and the second dielectric layer 32 directly on the gate structures 14. Therefore, after the CMP process, dishing 34 occurs on the first dielectric layer 26 within the gap 23.

Please refer to FIG. 4 and FIG. 5 again. Because the slurry of the CMP has a smaller etching rate to the buffering particles 30, and has a greater etching rate to the first dielectric layer 26 and the second dielectric layer 32. In this way, the buffering particles 30 can compensate the fast etching rate of the first dielectric layer 26 and the second dielectric layer 32 directly on gap 23, As a result, as shown in FIG. 5, dishing can be avoided.

As shown in FIG. 6, a second planarization process is performed to remove the protective layer 24 directly on the dummy gate 16 to expose the dummy gate 16. Later, the gate structure 14 including the dummy gate 16 and the gate dielectric layer 18 is removed to form a recess 36. Next, a high-k dielectric layer 38 and a metal layer 40 are formed to fill in the recess 36 and cover the first dielectric layer 26. Finally, the metal layer 40 and the high-k dielectric layer 38 are planarized by taking the first dielectric layer 26 as a stop layer to form a metal gate structure. The remaining metal layer 40 serves as a metal gate. Now, a transistor 100 of the present invention is completed.

Figure 8:
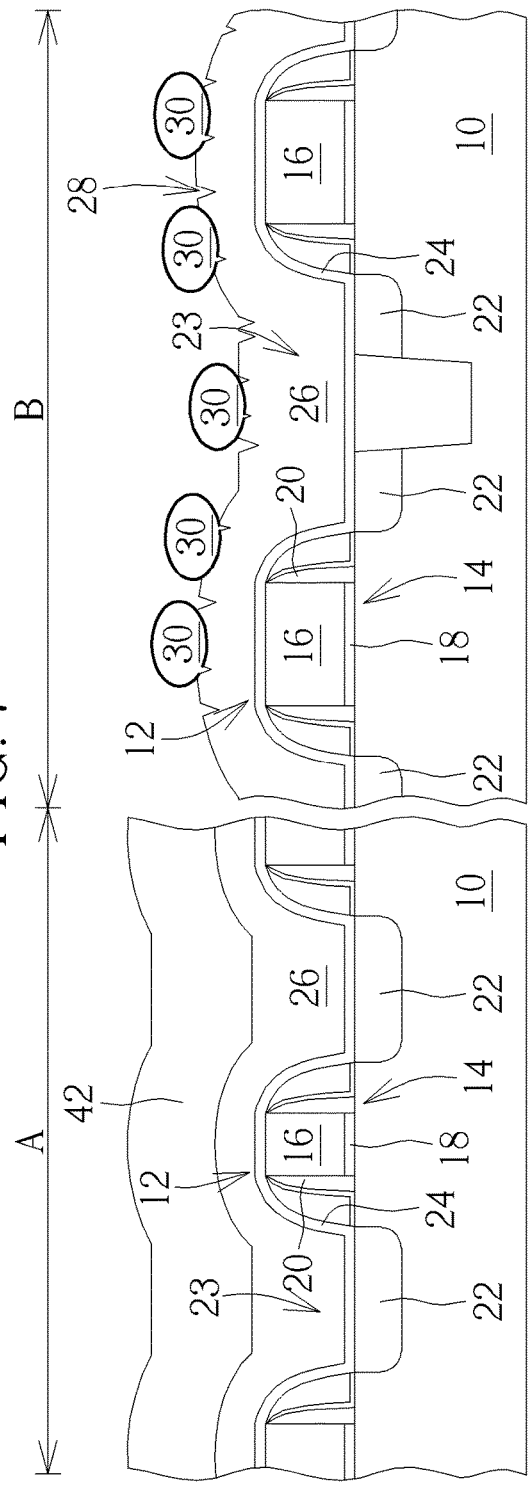
Figure 9:
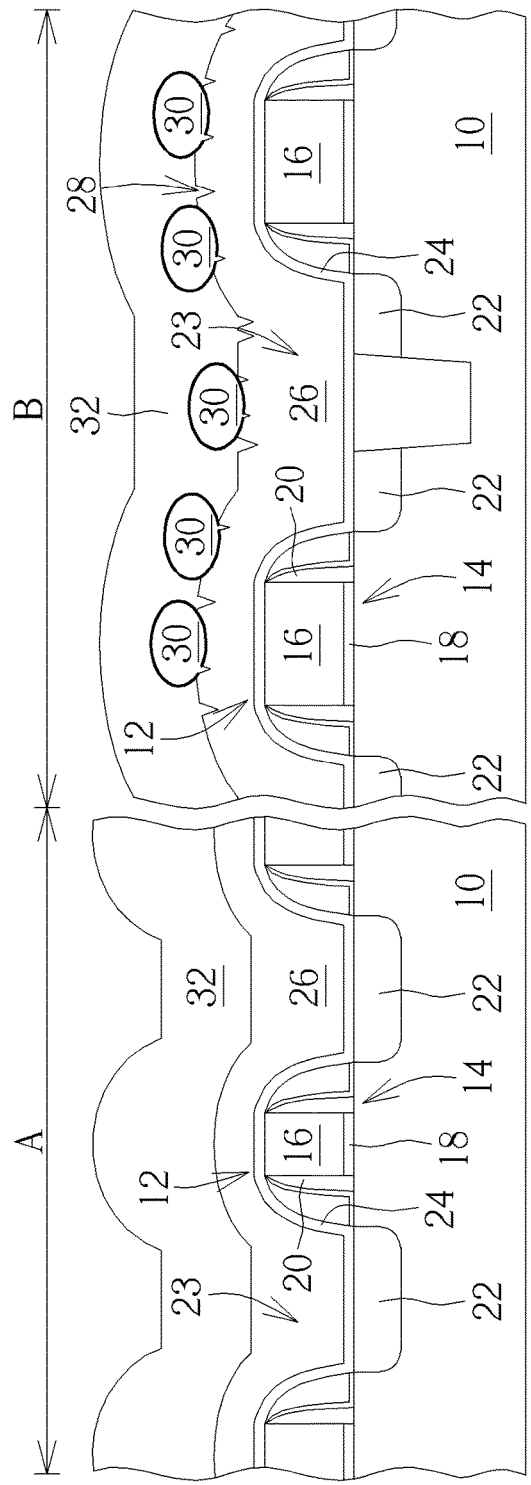

According to another preferred embodiment of the present invention, the buffering particles 30 can only be formed within the isolation region B. FIG. 8 to FIG. 9 depict another embodiment which shows the buffering particles only formed within an isolation region B, wherein like reference numerals are used to refer to like elements throughout. FIG. 8 is continuations of FIG. 1. As shown in FIG. 8, a mask layer 42 is formed to cover the dense region A and the isolation region B is exposed through the mask layer 42. Next, a roughen process is performed to roughen the surface of the first dielectric layer 26 within the isolation region B. In another case, the roughen process can be omitted. Subsequently, numerous buffering particles 30 are formed within the isolation region B.

As shown in FIG. 9, the mask layer 42 is removed. Later, a second dielectric layer 32 is formed to cover the first dielectric layer 26. After that, a first planarization process, steps of removing a dummy gate 16, steps of forming a metal gate are the same as that illustrated in FIG. 4 to FIG. 7. Please refer to FIG. 4 to FIG. 7 for details.

The prevent invention utilizes buffering particles to slow down the CMP process to the dielectric layer on the large gaps between two transistors. In this way, dishing on the surface of the dielectric layer on the large gaps can be prevented. Furthermore, the operation time of forming the buffering particles is shorter than the operation time for forming a buffering layer which has a continuous profile. Therefore, the process time can be reduced. Besides, if the gap between neighboring gates is extremely large, buffering particles 30 may be formed lower than top surface of the gates. In such circumstances, some of the buffering particles 30 may not be removed completely during the first planarization process. However, instead of using a continuous layer, since the buffering particles 30 have a discontinuous profile, the risk of creating undesired short path between contact structures and/or gates by the residual buffering particles is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of transistors, comprising:
providing a substrate with a plurality of transistors thereon, wherein each of the plurality of transistors comprises a gate structure, and a gap is disposed between gate structures which are adjacent to each other;

forming a protective layer and a first dielectric layer in sequence to cover the substrate and the plurality of transistors and to fill in the gap;

forming a plurality of buffering particles contacting the first dielectric layer, wherein the plurality of buffering particles do not contact each other;

forming a second dielectric layer to cover the plurality of buffering particles;

performing a first planarization process to remove part of the first dielectric layer, part of the second dielectric layer and the plurality of buffering particles by taking the protective layer as a stop layer, wherein a removing rate of the second dielectric layer is greater than a removing rate of the plurality of buffering particles during the first planarization process.

2. The fabricating method of transistors of claim 1, further comprising:
before forming the plurality of buffering particles, performing a roughening process to roughen the surface of the first dielectric layer.

3. The fabricating method of transistors of claim 2, wherein the roughening process comprises a wet etching or a dry etching.

4. The fabricating method of transistors of claim 1, wherein the plurality of buffering particles comprises amorphous silicon particles, polysilicon particles, silicon germanium particle or germanium particles.

5. The fabricating method of transistors of claim 1, wherein the plurality of buffering particles are formed by a furnace annealing process or an epitaxial growth process.

6. The fabricating method of transistors of claim 1, wherein the plurality of buffering particles are formed by a furnace annealing process performed at a temperature not greater than 700° C. and an operation time of the furnace annealing process is not greater than 30 minutes.

7. The fabricating method of transistors of claim 1, wherein the substrate is divided into a dense region and an isolation region, and the gap within the dense region is smaller than the gap within the isolation region.

8. The fabricating method of transistors of claim 7, further comprising:

forming a mask layer covering the dense region before forming the plurality of buffering particles;

forming the plurality of buffering particles within the isolation region; and removing the mask layer before forming the second dielectric layer.

9. The fabricating method of transistors of claim 1, wherein each of the plurality of the transistors further comprises two source/drain doping regions embedded in the substrate at two side of the gate structure, and the gate structure comprises a dummy gate, a gate dielectric layer and a spacer, wherein the spacer surrounds the dummy gate, and the gate dielectric layer is between the dummy gate and the substrate.

10. The fabricating method of transistors of claim 9, further comprising:
after the first planarization process, performing a second planarization process to remove the protective layer directly on the dummy gate and expose the dummy gate;

removing the dummy gate to form a recess;

forming a metal layer to fill in the recess and cover the first dielectric layer; and planarizing the metal layer by taking the first dielectric layer as a stop layer to form a metal gate.

11. The fabricating method of transistors of claim 9, wherein the positions of the plurality of buffering particles are higher than the top surface of the dummy gate.

12. The fabricating method of transistors of claim 1, wherein a removing rate of the first dielectric layer is greater than the removing rate of the plurality of buffering particles during the first planarization process.

13. The fabricating method of transistors of claim 1, wherein the first dielectric layer and the second dielectric layer are made of the same material.

14. The fabricating method of transistors of claim 1, wherein the first dielectric layer is silicon oxide, and the second dielectric layer is silicon oxide.

15. The fabricating method of transistors of claim 1, wherein the protective layer is silicon nitride, silicon oxynitride, silicon carbide nitride or silicon carboxynitride.

* * * * *